United States Patent [19]
Takemura et al.

[11] Patent Number: 5,759,739
[45] Date of Patent: Jun. 2, 1998

[54] RESIST COMPOSITION WITH POLYMERIC DISSOLUTION INHIBITOR AND ALKALI SOLUBLE RESIN

[75] Inventors: Katsuya Takemura; Toshinobu Ishihara; Kazumasa Maruyama; Yoshihumi Takeda, all of Joetsu; Minoru Shigemitsu, Kashima-gun; Ken'ichi Itoh, Joetsu, all of Japan

[73] Assignee: Shin-Etsu Chemical Co., Ltd., Tokyo, Japan

[21] Appl. No.: 635,856

[22] Filed: Apr. 22, 1996

Related U.S. Application Data

[63] Continuation of Ser. No. 227,759, Apr. 14, 1994, abandoned.

[30] Foreign Application Priority Data

Apr. 15, 1993 [JP] Japan ................. 5-112072
Jun. 1, 1993 [JP] Japan ................. 5-154461

[51] Int. Cl.$^6$ ....................... G03C 1/73
[52] U.S. Cl. ............. 430/270.1; 430/326; 430/910
[58] Field of Search ................... 430/270.1, 326, 430/910, 325

[56] References Cited

U.S. PATENT DOCUMENTS

| | | | |
|---|---|---|---|
| 5,324,804 | 6/1994 | Steinmann | 526/313 |
| 5,332,650 | 7/1994 | Murata et al. | 430/270.1 |
| 5,350,660 | 9/1994 | Urano et al. | 430/176 |
| 5,356,753 | 10/1994 | Yamada et al. | 430/270.1 |

FOREIGN PATENT DOCUMENTS

| | | | |
|---|---|---|---|
| 440 374 | 1/1991 | European Pat. Off. | G03F 7/039 |
| 0440374 | 8/1991 | European Pat. Off. | G03F 7/039 |
| 0499271 | 8/1992 | European Pat. Off. | G03F 7/038 |
| 586 496 | 4/1993 | European Pat. Off. | G03F 7/039 |

OTHER PUBLICATIONS

Patent Abstracts of Japan, JP 61-23971.

Patent Abstracts of Japan, JP 61-23970.

*Primary Examiner*—Bernard P. Codd

[57] ABSTRACT

A resist composition comprising an alkali-soluble resin, typically a partially t-butoxycarbonylated polyhydroxystyrene, a p-butoxystyrene/t-butylacrylate copolymer or p-butoxystyrene/maleic anhydride copolymer as a dissolution inhibitor, and a iodonium or sulfonium salt as a photoacid generator is effective for forming a resist film which can be precisely and finely patterned using high energy radiation such as a KrF excimer laser.

7 Claims, No Drawings

RESIST COMPOSITION WITH POLYMERIC DISSOLUTION INHIBITOR AND ALKALI SOLUBLE RESIN

This application is a continuation of application Ser. No. 08/227,759, filed Apr. 14, 1994, now abandoned.

BACKGROUND OF THE INVENTION

1. Field of the Invention

This invention relates to a resist composition of the chemically amplified type for use in forming fine patterns upon manufacture of super LSIs (large scale integration).

2. Prior Art

As the LSI technology tends toward higher integration and higher speed, further refinement of pattern rules is required. The patterning technology mostly relies on light exposure which is now approaching to the essential limit of resolution which is dictated by the wavelength of a light source.

It is generally recognized that in light exposure using g-ray (wavelength 436 nm) or i-ray (wavelength 365 nm) as a light source, a pattern rule of about 0.5 μm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultra-violet lithography is regarded promising as the next generation of fine patterning technology. The deep-UV lithography is capable of working on the order of 0.3 to 0.4 μm. If a less light absorbing resist is used, it is possible to form a pattern having a side wall nearly perpendicular to the substrate. The deep-UV lithography is also capable of pattern transfer all at once and thus affords an advantageous throughput than the electron beam lithography. Great attention is now paid to the technique of utilizing a high illuminance KrF excimer laser as a deep-UV light source. In order to employ this technique on a mass production scale, a resist material having low light absorption and high sensitivity is desired.

Well-known positive resists adapted for g- and i-ray exposure use diazonaphthoquinone-novolak resins. However, since these resins are very low in sensitivity and undergo light absorption in the deep-UV region, they cannot be used as deep-UV positive resists. For this reason, the mainstream of recently developed deep-UV positive resists is a chemically amplified resist composition comprising a photoacid generator capable of generating an acid upon exposure and a resin having an acid unstable group in its backbone.

One exemplary resin having an acid-sensitive substituent is polyhydroxystyrene having OH groups protected. Upon removal of the protective group with acid, the resin becomes soluble in a developer. A resist composition of two component system consisting essentially of such a resin and a photoacid generator is disclosed in Japanese Patent Application Kokai (JP-A) No. 251259/1992 or EP 476865. In this two-component system resist composition, however, many OH groups must be protected so that unexposed areas may not be dissolved in the developer while many protective groups must be decomposed so that exposed areas may be dissolved in the developer. This undesirably leaves the increased possibility of changing film thickness and introducing stresses and bubbles in the film.

Then proposed was a chemically amplified resist composition having functions further diversified, that is, a three-component system comprising an alkali-soluble resin, a dissolution inhibitor, and a photoacid generator. This three-component system resist is more effective for precise fine patterning because the amount of dissolution inhibitor which is to be decomposed with the acid is reduced and the above-mentioned possibility of changing film thickness and generating bubbles is minimized.

One exemplary three-component system resist is disclosed in JP-A 212159/1992. However, the resin used in this resist is a novolak resin which has light absorption in the deep-UV region and is thus inadequate for fine patterning.

Resins having less light absorption in the deep-UV region include polyhydroxystyrene having OH groups protected. One exemplary three-component resist composition comprising polyhydroxystyrene having OH groups protected, a dissolution inhibitor, and a photoacid generator is disclosed in JP-A 289659/1991. Since the photoacid generator used therein is an alkyl-sulfonic acid, this resist is very low in sensitivity and requires a longer exposure time.

A number of chemically amplified positive resist compositions have been proposed as mentioned above although they have some problems and are difficult to use in practice.

SUMMARY OF THE INVENTION

Making investigations on a positive resist composition of high energy ray exposure type having high sensitivity, high resolution and process adaptability, the inventors have found that a three-component system resist composition comprising an alkali-soluble resin, a dissolution inhibitor, and a photoacid generator is improved by using an onium salt of the general formula (1) as the photoacid generator and a polymer of the general formula (2) and/or (3) as the dissolution inhibitor, the formulae being shown below. Use of such specific agents minimizes the possibility of changing film thickness and generating bubbles. The resulting positive resist composition is highly sensitive to high energy radiation such as deep ultraviolet rays, electron rays, and X rays and useful in precise fine patterning.

Photoacid generator:

$$(R^1)_n MX \qquad (1)$$

In formula (1), $R^1$ is independently selected from substituted or unsubstituted aromatic groups, M is sulfonium or iodonium, X is p-toluenesulfonate or trifluoromethanesulfonate, and letter n is 2 or 3.

Dissolution inhibitor:

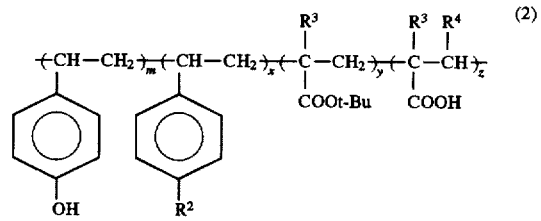

$$(2)$$

In formula (2), $R^2$ is a hydrogen atom, an alkyl group having 1 to 6 carbon atoms or an alkoxy group having 1 to 6 carbon atoms, $R^3$ is a hydrogen atom or a methyl group, $R^4$ is a hydrogen atom, a COOH group or a COOt-Bu group, t-Bu is a t-butyl group, and m, x, y and z are $0 \leq m \leq 0.9$, $0 < x \leq 0.9$, $0 < y \leq 0.9$, $0 \leq z \leq 0.5$ and $m+x+y+z=1$. The weight average molecular weight of the polymer of formula (2) is in the range of 500 to 10,000.

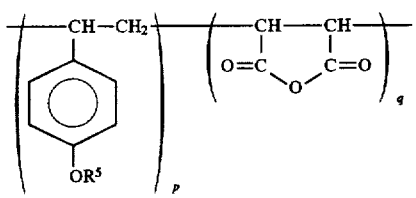

In formula (3), $R^5$ is a hydrogen atom or a methyl group, and letters p and q are such that $q/(p+q)$ is from 0.1 to 0.9. The weight average molecular weight of the polymer of formula (3) is in the range of 500 to 10,000.

In chemically amplified positive resist compositions of the three-component system, known means for enhancing sensitivity is to use an onium salt as a photoacid generator capable of generating an acid upon light exposure. Resist compositions using onium salts tend to form an overhang (T top) in patterning, failing to achieve fine resolution. This is partially because of shortage of solubility required when a three-component system resist film upon exposure follows the mechanism that protective groups unstable to acid in the base resin and dissolution inhibitor are decomposed by the acid resulting from the photoacid generator so that the resist film becomes soluble in an aqueous alkali solution or developer. The dissolution inhibitor and base resin of the resist composition in unexposed areas remains insoluble in the aqueous alkali solution or developer while they lose the dissolution inhibition effect in exposed areas so that the dissolution rate is accelerated over that available prior to exposure. At the (exposed) surface of the resist film, however, less of the photoacid generator is distributed and the acid resulting therefrom can volatilize off or be inactivated by contamination from the ambient atmosphere so that protective groups survive in the base resin and dissolution inhibitor to retain the dissolution inhibition effect or form a substantially insoluble surface layer, resulting in a T-top pattern.

Seeking for the dissolution inhibitor which is more effective than conventional ones in solubility in an aqueous alkali solution not only at the resist interior, but also at the resist surface, the inventors have found that the solubility of the substituent group in the aqueous alkali solution decreases in the order of COOH group>phenolic OH group>alcoholic OH group and that a dissolution inhibitor having a COOH group protected by a substituent group in a molecule is effective. The acid-sensitive protective groups include t-butoxycarbonyl, tetrahydropyranyl, t-butyl groups and carboxylic anhydrides. Among these, the t-butyl group and carboxylic anhydrides are effective protective groups because the t-butoxycarbonyl group is thermally unstable and the tetrahydropyranyl group is decomposable with acid in an aqueous system, but not in a water-free system as in resist film. We have also found that among such dissolution inhibitors from monomeric to polymeric forms, the polymer of general formula (2) or (3) provides a greater dissolution inhibition effect and after exposure, yields COOH groups as a result of splitting off of the protective groups and is thus substantially increased in solubility. Rather than the monomer, the polymer is easy to control its molecular weight, degree of copolymerization and solubility. The polymer is also advantageous in increasing the thermal and mechanical strength of a resist film. The present invention is predicated on these findings.

Briefly stated, the present invention provides a resist composition comprising (A) an onium salt of the general formula (1),
(B) an alkali-soluble resin, and
(C) a dissolution inhibitor of the general formula (2) and/or (3).

Preferably, alkali-soluble resin (B) is a polyhydroxystyrene in which some hydroxyl groups are replaced by acid unstable groups, having a molecular weight of 5,000 to 100,000.

DETAILED DESCRIPTION OF THE INVENTION

Component (A) is an onium salt of the general formula (1) which is capable of generating a strong acid upon exposure to high energy radiation such as deep-ultraviolet rays, electron rays and X-rays.

$$(R^1)_n MX \tag{1}$$

In formula (1), $R^1$ groups, which may be identical or different, are selected from substituted or unsubstituted aromatic groups, M is sulfonium or iodonium, X is p-toluene-sulfonate or trifluoromethanesulfonate, and letter n is 2 or 3. A phenyl group is a typical unsubstituted aromatic group. Examples of substituted aromatic group include phenyl and other aromatic groups having a substituent such as linear or branched alkyl, alkoxy, cycloalkyl and haloalkyl groups having 1 to 10 carbon atoms, and halogen atoms. Iodonium and sulfonium salts are preferred among these onium salts and their examples are shown below.

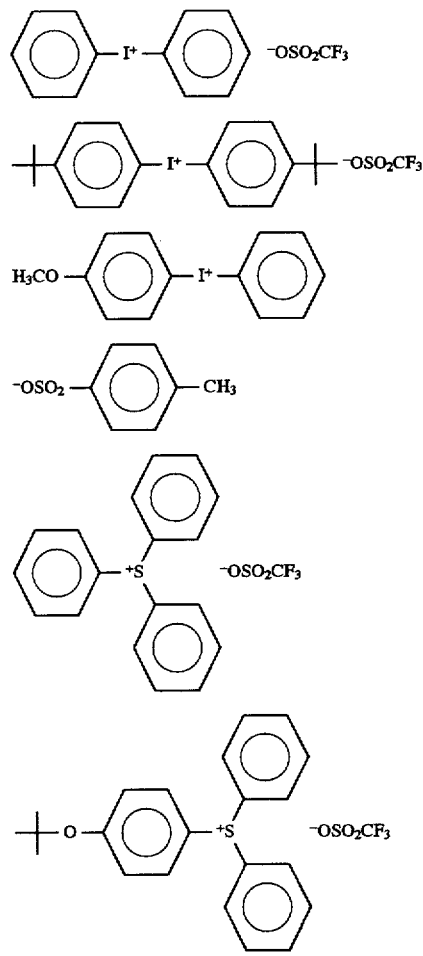

The onium salt used herein is not limited to these examples as long as it is capable of generating an acid upon exposure to high energy radiation.

Onium salt (A) as the photoacid generator is preferably used in an amount of 0.5 to 15% by weight of the total weight of components (A) to (C). With less than 0.5% by weight of the photoacid generator, the composition would sometimes have low sensitivity though it still retains positive resist performance. As the amount of photoacid generator increases, the resist is increased in sensitivity and improved in contrast. Above 15% by weight of the photoacid generator, no further increase of sensitivity is expected though the composition still retains positive resist performance. Since the photoacid generator is an expensive reagent and an increase of a low molecular weight component in the resist can lower the mechanical strength of a resist film, it is recommended to add the photoacid generator in an amount of up to 15% by weight.

The alkali-soluble resin as component (B) may be selected from polyhydroxystyrenes and novolak resins, for example. Since the novolak resins have light absorption in the far-UV region, use of polyhydroxystyrene is preferred. Preferred polyhydroxystyrenes are those in which some hydroxyl (OH) groups are replaced by acid unstable groups such as t-butyl (t-Bu) and t-butoxycarbonyl (t-Boc) groups.

The degree of substitution of the acid unstable group is preferably 5 to 50 mol %, preferably 10 to 30 mol % of OH groups. Less than 5 mol % would cause a large film loss of resist films. More than 50 mol % would result in a low dissolution. They preferably have a molecular weight of 5,000 to 100,000.

Component (B) is preferably blended in an amount of at least 55% by weight, especially 60 to 80% by weight of the total weight of components (A) to (C). A composition containing less than 55% by weight of resin would be inconvenient to coat and would form a weak resist film.

The dissolution inhibitor as component (C) is represented by the following formula (2) or (3).

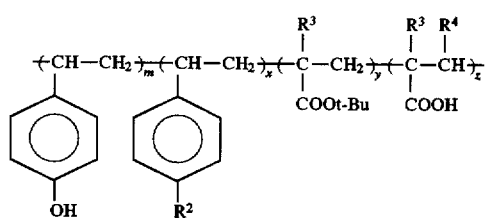

In formula (2), $R^2$ is a hydrogen atom, an alkyl group having 1 to 6 carbon atoms or an alkoxy group having 1 to 6 carbon atoms. Preferably, $R^2$ is hydrogen atom or t-butoxy group. More preferably, $R^2$ is t-butoxy group which can be removed with an acid to become alkali soluble. $R^3$ is a hydrogen atom or a methyl group. $R^4$ is a hydrogen atom, a COOH group or a COOt-Bu group, t-Bu is a t-butyl group, and m, x, y and z are $0 \leq m \leq 0.9$, $0 < x \leq 0.9$, $0 < y \leq 0.9$, $0 \leq z \leq 0.5$ and m+x+y+z=1. Preferably, $0.3 \leq m \leq 0.7$, $0 < x \leq 0.9$, $0 < y \leq 0.9$ and $0 \leq z \leq 0.5$, and more preferably, $0.3 \leq m \leq 0.5$, $0 < x \leq 0.9$, $0 < y \leq 0.9$ and $0 \leq z \leq 0.1$. If m is over 0.9 or z is over 0.5, the dissolution inhibitor effect would not be exerted well and the film loss of the resist film would become much. If x is over 0.9 or y is over 0.9, the compatibility to a base polymer and the wettability to a developing solution would not be improved well.

As the polymer of formula (2), the following polymer having a formula of (2a) is preferred.

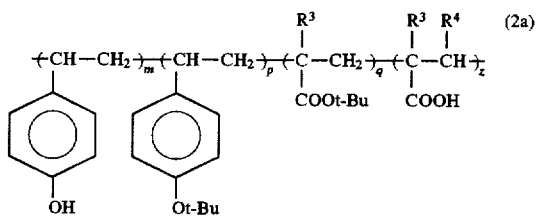

In formula (2a), $0.1 \leq p \leq 0.9$ and $0.1 \leq q \leq 0.9$, preferably, $0.3 \leq p \leq 0.7$ and $0.3 \leq q \leq 0.7$, q/(p+q)=0.1 to 0.9, preferably 0.3 to 0.7. $R^3$, $R^4$, m and z are the same meanings as above.

In this connection, the introduction of a hydroxystyrene structural unit and/or an acrylic or methacrylic acid structural unit to the polymer of formula (2) can improve the solubility of the polymer to a solvent for a resist composition and the compatibility to the base resin, resulting in an excellent film forming ability upon application of a resist composition solution on a silicon wafer. Further, the introduction of the hydroxystyrene structural unit and/or an acrylic or methacrylic acid structural unit can improve the wettability of the resist film to an alkali developer aqueous solution.

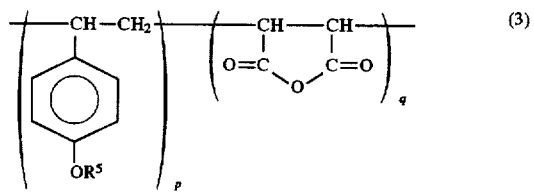

In the formula (3), $R^5$ is a hydrogen atom or a methyl group, and letters p and q are such that q/(p+q) is from 0.1 to 0.9, preferably from 0.3 to 0.7.

These polymers (2) and (3) preferably have a weight average molecular weight of 500 to 10,000, preferably 500 to 4,000. The compounds of formulae (2) and (3) may be used alone or in admixture of two or more.

The dissolution inhibitor of formula (2) can be readily prepared by copolymerizing hydroxystyrene, substituted or unsubstituted styrene, t-butyl acrylate or methacrylate and acrylic or methacrylic acid at a molar ratio of m:x:y:z. Similarly the dissolution inhibitor of formula (3) can be readily prepared by copolymerizing t-butoxystyrene with maleic anhydride.

Component (C) is preferably blended in an amount of 7 to 40% by weight, especially 10 to 30% by weight of the total weight of components (A) to (C). Less than 7% by weight of the dissolution inhibitor would provide less dissolution inhibition effect whereas more than 40% by weight of the dissolution inhibitor would make it difficult to control solubility after exposure.

The resist composition of the present invention is generally prepared by dissolving components (A), (B) and (C) in an organic solvent. The organic solvent used herein is desirably one in which the respective components are fully soluble and which allows for uniform spread of a resist film. Examples include butyl acetate, xylene, acetone, cellosolve acetate, ethylene glycol monomethyl ether, diethylene glycol monomethyl ether, ethylene glycol monoethyl ether, diethylene glycol dibutyl ether, diethylene glycol dimethyl ether (diglyme), ethyl lactate, methyl lactate, propyl lactate, and butyl lactate alone or in admixture of two or more. The amount of organic solvent blended is preferably a multiple of the total amount of components (A) to (C).

The resist composition may be subject to a patterning process as described below.

The resist composition solution is spin coated on a substrate to form a resist film which is pre-baked and exposed to high energy radiation. Upon exposure, the photoacid generator is decomposed to generate an acid. Baking after exposure causes the acid to catalyze decomposition of the anti-dissolution or protective group, with the dissolution inhibition effect being lost. The resist film is then developed with an aqueous alkali solution and rinsed with water, yielding a resist having a positive pattern.

The resulting pattern is characterized by increased contrast and high resolution since the dissolution inhibition effect of the present inhibitor is greater than conventional dissolution inhibitors before exposure and is lost after exposure to more greatly enhance solubility. Increased solubility after exposure is also effective in improving a T top pattern.

There has been described a positive resist composition which is sensitive to high energy radiation, improved in sensitivity, resolution and plasma etching resistance, and yields a resist pattern having higher heat resistance. The resist pattern has little tendency of overhanging, implying improved dimensional control. The composition is free of metal elements, requires post-exposure baking (PEB) during chemical amplification process so that the time dependency of resist properties after exposure is minimized. Eliminated need for water in the chemical amplification process renders the system simpler. Therefore, the composition is useful in fine patterning using electron and deep-UV rays. By virtue of reduced absorption at the exposure wavelength of a KrF excimer laser, a fine pattern having perpendicular walls to the substrate can be readily formed.

EXAMPLE

Examples of the present invention are given below by way of illustration and not by way of limitation.

Synthesis 1
Synthesis of p-butoxystyrene/t-butyl acrylate copolymer

In an autoclave equipped with a 1.5-liter glass polymerization vessel and purged with nitrogen, polymerization reaction was carried out by dissolving 225.0 grams (1.28 mol) of p-butoxystyrene and 25.0 grams (0.20 mol) of t-butyl acrylate in 500 grams of acetone, adding 7.5 grams of t-butylperoxy(2-ethylhexanoate) as a polymerization catalyst, and heating the mixture at 90° C. Thereafter, the catalyst was added in incremental amounts, that is, 5.0 grams after 2½ hours and 2.5 grams after 4½ hours from the start of polymerization reaction. After 6 hours of polymerization, the reaction solution was cooled down and the acetone was distilled off. A 9/1 methanol/water mixture was added to the reaction solution, causing the copolymer to crystallize. The copolymer had a weight average molecular weight (Mw) of 9,200, a dispersity (Mw/Mn) of 1.64, and a copolymerization ratio of 6:1. The yield was 70.0%.

Synthesis 2
Synthesis of p-butoxystyrene/p-hydroxystyrene/t-butyl acrylate copolymer In an autoclave equipped with a 1.0-liter glass polymerization vessel and purged with nitrogen, polymerization reaction was carried out by dissolving 19.4 grams (0.11 mol) of p-butoxystyrene, 13.2 grams (0.11 mol) of p-hydroxystyrene and 25.0 grams (0.20 mol) of t-butyl acrylate in 300 grams of acetone, adding 3.5 grams of t-butylperoxy(2-ethylhexanoate) as a polymerization catalyst, and heating the mixture at 90° C. Thereafter, the catalyst was added in incremental amounts, that is, 1.0 grams after 2½ hours and 1.0 grams after 4½ hours from the start of polymerization reaction. After 6 hours of polymerization, the reaction solution was cooled down and the acetone was distilled off. A 9/1 methanol/water mixture was added to the reaction solution, causing the copolymer to crystallize. The copolymer had a weight average molecular weight (Mw) of 6,900, a dispersity (Mw/Mn) of 1.72, and a copolymerization ratio (p-butoxystyrene/p-hydroxystyrene/t-butyl acrylate) of 1:1:2. The yield was 70.0%.

Synthesis 3
Synthesis of p-butoxystyrene/p-hydroxystyrene/t-butyl acrylate/acrylic acid copolymer In an autoclave equipped with a 1.0-liter glass polymerization vessel and purged with nitrogen, polymerization reaction was carried out by dissolving 19.4 grams (0.11 mol) of p-butoxystyrene, 13.2 grams (0.11 mol) of p-hydroxystyrene, 25.0 grams (0.20 mol) of t-butyl acrylate, and 0.7 grams (0.01 mol) of acrylic acid in 300 grams of acetone, adding 3.5 grams of t-butylperoxy(2-ethylhexanoate) as a polymerization catalyst, and heating the mixture at 90° C. Thereafter, the catalyst was added in incremental amounts, that is, 1.0 grams after 2½ hours and 1.0 grams after 4½ hours from the start of polymerization reaction. After 6 hours of polymerization, the reaction solution was cooled down and the acetone was distilled off. A 9/1 methanol/water mixture was added to the reaction solution, causing the copolymer to crystallize. The copolymer had a weight average molecular weight (Mw) of 6,200, a dispersity (Mw/Mn) of 1.70, and a copolymerization ratio (p-butoxystyrene/p-hydroxystyrene/t-buyl acrylate/acrylic acid) of 1:1:2:0.1, the yeild was 58.0%.

Synthesis 4
Synthesis of p-butoxystyrene/t-butyl acrylate/acrylic acid copolymer In an autoclave equipped with a 1.0-liter glass polymerization vessel and purged with nitrogen, polymerization reaction was carried out by dissolving 19.4 grams (0.11 mol) of p-butoxystyrene, 25.0 grams (0.20 mol) of t-butyl acrylate and 0.7 grams (0.01 mol) of acrylic acid in 300 grams of acetone, adding 3.5 grams of t-butylperoxy(2-ethylhexanoate) as a polymerization catalyst, and heating the mixture at 90° C. Thereafter, the catalyst was added in incremental amounts, that is, 1.0 grams after 2½ hours and 1.0 grams after 4½ hours from the start of polymerization reaction. After 6 hours of polymerization, the reaction solution was cooled down and the acetone was distilled off. A 9/1 methanol/water mixture was added to the reaction solution, causing the copolymer to crystallize. The copolymer had a weight average molecular weight (Mw) of 6,000, a dispersity (Mw/Mn) of 1.70, and a copolymerization ratio (p-butoxystyrene/t-butyl acrylate/acrylic acid) of 1:2:0.1, the yield was 64.0%.

Synthesis 5
Synthesis of p-butoxystyrene/maleic anhydride copolymer

In an autoclave equipped with a 1.5-liter glass polymerization vessel and purged with nitrogen, polymerization reaction was carried out by dissolving 125.0 grams (0.71 mol) of p-butoxystyrene and 125.0 grams (1.28 mol) of maleic anhydride in 500 grams of acetone, adding 7.5 grams of t-butylperoxy(2-ethylhexanoate) as a polymerization catalyst, and heating the mixture at 90° C. Thereafter, the catalyst was added in incremental amounts, that is, 5.0 grams after 2½ hours and 2.5 grams after 4½ hours from the start of polymerization reaction. After 6 hours of polymerization, the reaction solution was cooled down and the acetone was distilled off. A 9/1 methanol/water mixture was added to the reaction solution, causing the copolymer to crystallize. The copolymer had a weight average molecular weight (Mw) of 9,600, a dispersity (Mw/Mn) of 1.58, and a copolymerization ratio of 6:7. The yield was 70.0%.

EXAMPLE 1

| Components | Parts by weight |
| --- | --- |
| Base resin: | |
| partially t-butoxycarbonylated polyhydroxystyrene (t-Boc content: 20.0% Mw = 14,000, Mw/Mn = 1.07) | 80.0 |
| Dissolution inhibitor: | |
| Copolymer of Synthesis 1 | 16.0 |
| Photoacid generator: | |
| triphenylsulfonium triflate | 4.0 |
| Solvent: | |
| diethylene glycol dimethyl ether | 500 |

A resist solution of these components was spin coated on a silicon substrate at 2,000 rpm and pre-baked at 100° C. for 2 minutes on a hot plate. The resist film was 0.95 µm thick. Using a KrF excimer laser, a pattern was drawn on the resist film. The resist film was baked at 80° C. for one minute, then developed for one minute with an aqueous solution of 2.38% tetramethylammonium hydroxide (TMAH), and rinsed with water for 30 seconds.

The resist film had a sensitivity of 10.0 mJ/cm$^2$ (Eth value) and bore a positive pattern. The resolution was 0.25 µm for line and space patterns and 0.30 µm for a hole pattern and the pattern had perpendicular side walls.

EXAMPLE 2

A resist film was prepared by the same procedure as in Example 1 except that the dissolution inhibitor was changed to the copolymer of Synthesis 2. The sensitivity of the resist film was 8 mJ/cm$^2$ (Eth value (exposure of threshold)). The resolution was 0.25 µm for line and space patterns and 0.30 µm for a hole pattern and the pattern had perpendicular side walls.

EXAMPLE 3

A resist film was prepared by the same procedure as in Example 1 except that the dissolution inhibitor was changed to the copolymer of Synthesis 3. The sensitivity of the resist film was 8 mJ/cm$^2$ (Eth value). The resolution was 0.25 µm for line and space patterns.

EXAMPLE 4

A resist film was prepared by the same procedure as in Example 1 except that the dissolution inhibitor was changed to the copolymer of Synthesis 4. The sensitivity of the resist film was 8 mJ/cm (Eth value). The resolution was 0.25 µm for line and space patterns.

EXAMPLE 5

| Components | Parts by weight |
| --- | --- |
| Base resin: | |
| partially t-butoxycarbonylated polyhydroxystyrene (t-Boc content: 15.0% Mw = 14,000, Mw/Mn = 1.07) | 80.0 |
| Dissolution inhibitor: | |
| Copolymer of Synthesis 5 | 16.0 |
| Photoacid generator: | |
| p-butoxyphenyldiphenyl-sulfonium triflate | 4.0 |
| Solvent: | |
| diethylene glycol dimethyl ether | 500 |

A resist solution of these components was spin coated on a silicon substrate at 2,000 rpm and pre-baked at 100° C. for 2 minutes on a hot plate. The resist film was 0.95 µm thick. Using a KrF excimer laser, a pattern was drawn on the resist film. The resist film was baked at 80° C. for one minute, then developed for one minute with an aqueous solution of 2.38% tetramethylammonium hydroxide (TMAH), and rinsed with water for 30 seconds.

The resist film had a sensitivity of 10.0 mJ/cm$^2$ (Eth value) and bore a positive pattern. The resolution was 0.25 µm for line and space patterns and 0.3 µm for a hole pattern and the pattern had perpendicular side walls.

EXAMPLE 6

A resist film was prepared by the same procedure as in Example 1 except that the acid release agent was changed to bis(t-butylphenyl)iodonium triflate. The sensitivity of the resist film lowered to 15 mJ/cm$^2$ (Eth value), but the resolution was 0.25 µm for line and space patterns.

EXAMPLE 7

A resist film was prepared by the same procedure as in Example 2 except that the acid release agent was changed to bis(t-butylphenyl)iodonium triflate. The sensitivity of the resist film lowered to 15 mJ/cm$^2$ (Eth value), but the resolution was 0.30 µm for line and space patterns.

EXAMPLE 8

A resist film was prepared by the same procedure as in Example 3 except that the acid release agent was changed to bis(t-butylphenyl)iodonium triflate. The sensitivity of the resist film lowered to 12 mJ/cm$^2$ (Eth value), but the resolution was 0.25 µm for line and space patterns.

EXAMPLE 9

A resist film was prepared by the same procedure as in Example 4 except that the acid release agent was changed to bis(t-butylphenyl)iodonium triflate. The sensitivity of the resist film lowered to 12 mJ/cm$^2$ (Eth value), but the resolution was 0.30 µm for line and space patterns.

EXAMPLE 10

A resist film was prepared by the same procedure as in Example 5 except that the photoacid generator was changed to bis(t-butylphenyl)iodonium triflate. The sensitivity of the resist film lowered to 15 mJ/cm² (Eth value), but the resolution was 0.25 μm for line and space patterns.

Although some preferred embodiments have been described, many modifications and variations may be made thereto in the light of the above teachings. It is therefore to be understood that within the scope of the appended claims, the invention may be practiced otherwise than as specifically described.

We claim:

1. A resist composition comprising (A) an onium salt of the general formula (1):

wherein $R^1$ is independently selected from a phenyl group or a phenyl group having a substituent selected from the group consisting of linear or branched alkyl, alkoxy, cycloalkyl and halo alkyl groups having 1 to 10 carbon atoms, and halogen atoms, M is sulfonium or iodonium, X is p-toluenesulfonate or trifluoromethanesulfonate, and letter n is 2 or 3, (B) a polyhydroxystyrene having a weight average molecular weight of 5,000 to 100,000 in which some hydroxy groups are replaced by acid unstable groups, and (C) a dissolution inhibitor selected from compounds of the general formulae (2) and/or (3):

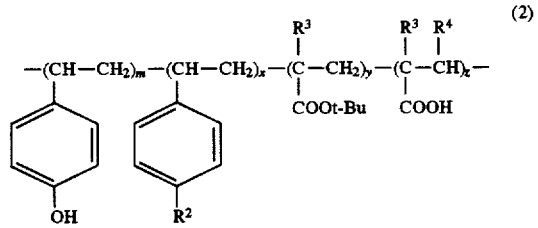

wherein $R^2$ is a hydrogen atom, an alkyl group having 1 to 6 carbon atoms or an alkoxy group having 1 to 6 carbon atoms, $R^3$ is a hydrogen atom or a methyl group, $R^4$ is a hydrogen atom or a COOH group, t-Bu is a t-butyl group, and m, x, y and z are $0 \leq m \leq 0.9$, $0 < x \leq 0.9$, $0 < y \leq 0.9$, $0 \leq z \leq 0.5$ and $m+x+y+z=1$,

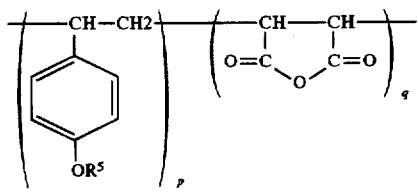

wherein $R^5$ is a hydrogen atom or a methyl group, and letters p and q are such that $q/(p+q)$ is from 0.1 to 0.9.

2. A resist composition according to claim 1 wherein in the polyhydroxystyrene, some hydroxyl groups are replaced by t-butyl or t-butoxycarbonyl groups.

3. A resist composition as in claim 1, wherein the polyhydroxystyrene contains acid unstable groups selected from the group consisting of t-butyl and t-butoxy carbonyl groups.

4. A resist composition comprising (A) an onium salt of the general formula (1):

wherein $R^1$ is independently selected from a phenyl group or a phenyl group having a substituent selected from the group consisting of linear or branched alkyl, alkoxy, cycloalkyl and halo alkyl groups having 1 to 10 carbon atoms, and halogen atoms, M is sulfonium or iodonium, X is p-toluenesulfonate or trifluoromethanesulfonate, and n is 2 or 3, (B) a polyhydroxystyrene having a weight average molecular weight of 5,000 to 100,000 in which some hydroxyl groups are replaced by acid unstable groups, and (C) a dissolution inhibitor selected from compounds of the general formulae (2) and/or (3):

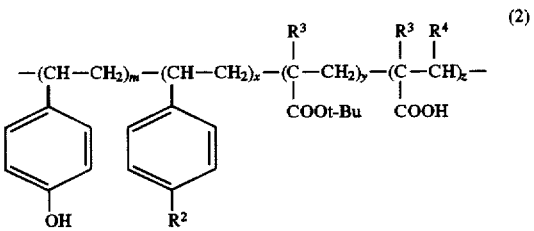

wherein $R^2$ is a hydrogen atom, an alkyl group having 1 to 6 carbon atoms or an alkoxy group having 1 to 6 carbon atoms, $R^3$ is a hydrogen atom or a methyl group, $R^4$ is a hydrogen atom or a COOH group, t-Bu is a t-butyl group, and m, x, y and z are $0 \leq m \leq 0.9$, $0 < x \leq 0.9$, $0 < y \leq 0.9$, $0 \leq z \leq 0.5$ and $m+x+y+z=1$;

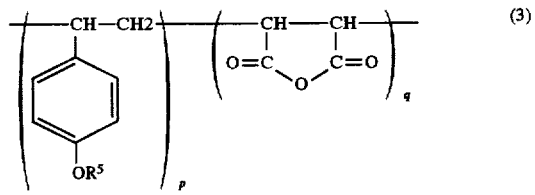

wherein $R^5$ is a hydrogen atom or a methyl group, and letters p and q are such that $q/(p+q)$ is from 0.1 to 0.9; in the amounts of 0.5 to 15% by weight of onium salt (A), at least 55% by weight of resin (B), and 7-40% by weight of dissolution inhibitor (C), based on the total weight of components (A), (B), and (C).

5. A resist composition according to claim 4, wherein, in the polyhydroxystyrene, some hydroxyl groups are replaced by t-butyl or t-butoxycarbonyl groups.

6. A resist composition according to claim 4, which comprises 60–80% by weight component (B) and 10–30% by weight component (C).

7. A resist composition as in claim 4, wherein the polyhydroxystyrene contains acid unstable groups selected from the group consisting of t-butyl and t-butoxy carbonyl groups.

* * * * *